United States Patent [19]

Rzepecki et al.

[11] Patent Number: 4,528,222
[45] Date of Patent: Jul. 9, 1985

[54] CONDUCTIVELY PRINTED FLEXIBLE SHEET MATERIAL

[75] Inventors: Ray M. Rzepecki, North Scituate, R.I.; Victor H. Weiss, Bridgeport, Conn.

[73] Assignee: Pervel Industries, Inc., Plainfield, Conn.

[21] Appl. No.: 449,401

[22] Filed: Dec. 13, 1982

Related U.S. Application Data

[63] Continuation-in-part of Ser. No. 257,242, Apr. 24, 1981, abandoned.

[51] Int. Cl.[3] .......................... B32B 3/22; B32B 3/24; B65D 73/02; B65D 85/42
[52] U.S. Cl. ...................................... 428/35; 206/328; 206/334; 206/524.3; 206/524.4; 206/524.6; 361/212; 428/105; 428/114; 428/137; 428/201; 428/203; 428/204; 428/922
[58] Field of Search ...................... 206/328, 334, 524.3, 206/524.4, 524.6; 361/212; 428/35, 105, 114, 206, 207, 211, 922, 131, 137, 195, 201, 203, 204

[56] References Cited

U.S. PATENT DOCUMENTS

| | | | |
|---|---|---|---|
| 2,416,202 | 2/1947 | Naumann | 428/922 |
| 3,572,499 | 3/1971 | Mondano | 361/220 |
| 4,154,344 | 5/1979 | Yenni et al. | 428/922 |

FOREIGN PATENT DOCUMENTS

| | | | |
|---|---|---|---|
| 611463 | 12/1960 | Canada | 428/922 |
| 2310166 | 9/1963 | Fed. Rep. of Germany | 428/922 |
| 1103698 | 2/1968 | United Kingdom | 428/195 |

Primary Examiner—Bruce H. Hess
Attorney, Agent, or Firm—Hopgood, Calimafde, Kalil, Blaustein & Judlowe

[57] ABSTRACT

The invention contemplates flexible sheet material having static-dissipative properties and adaptable to wrapping or otherwise containing electronic components or the like which are to be protected against damaging exposure to an electrostatic charge. The sheet material is basically of relatively high surface resistance and is static-dissipative by reason of printed application of a matrix design, using electrically conductive ink, such that at least first and second intersecting sets of spaced plural conductive paths are established at the printed surface. The material is non-sparking by reason of the printed conductive ink being disposed between layers of relatively high surface resistance.

7 Claims, 10 Drawing Figures

CONDUCTIVELY PRINTED FLEXIBLE SHEET MATERIAL

RELATED CASE

This application is a continuation-in-part of our co-pending application Ser. No. 257,242, filed Apr. 24, 1981, now abandoned.

BACKGROUND OF THE INVENTION

The invention relates to static-dissipating sheet material suitable for wrapping or other containment of electronic components which are to be protected against damaging exposure to an electrostatic charge.

The use of conductive films or laminates employing conductive films or foils is known to provide electrostatic shielding, but certain micro-electronic components are so intricate and delicate that the known films and/or foils can cause damage through too rapid a discharge of a charged condition; close inspection of such rapid discharges often reveals sparking. Also, such films and/or foils are opaque and therefore require handling and/or opening manipulation in order to permit visual inspection of wrapped or otherwise enclosed contents.

BRIEF STATEMENT OF THE INVENTION

It is an object of the invention to provide a sheet material of the character indicated, having surface resistance of static-dissipative magnitude, and to provide a container made of such material, to enable safe discharge of an electrostatic-charge condition, for example, with respect to microelectronic components within the container.

Another specific object is to meet the above objects with such an essentially translucent or transparent sheet material, for application to wrapping or other enclosing containment of delicate contents, as to permit a degree of visual inspection of contents, without need for opening manipulation of the enclosure.

A further specific object is to provide a material and container of the character indicated wherein surfaces of the material are static-dissipative and wherein a more conductive subsurface region is provided, using conventional printing techniques as far as possible.

It is also a specific object to provide a container meeting the above objects while providing effectively Faraday-cage protection to container contents, with the feature of non-sparking dissipation of static charge between the "cage" and container contents and, between the "cage" and a source external to the container.

A general object is to meet all objects with extreme cost economy while achieving superior static-dissipative and non-sparking properties.

The invention achieves the foregoing objects by printed application to commercial high-resistance sheet material of a network or mesh design of intersecting lines of conductive ink, to one surface of relatively high-resistance print-grade sheet material, which may be one of a variety of plastics, or paper, or cardboard. The thus-printed sheet material is then coated or laminated with relatively high-resistance material over the printed surface, to provide a non-sparking product which lends itself to a variety of applications and embodiments.

DETAILED DESCRIPTION

The invention will be illustratively described in detail in conjunction with the accompanying drawings in which.

Figure 1:
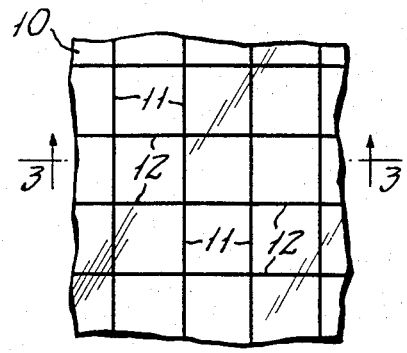
FIGS. 1 and 2 are similar fragmentary plan views to illustrate two sheet-material embodiments of the invention.
Figure 2:
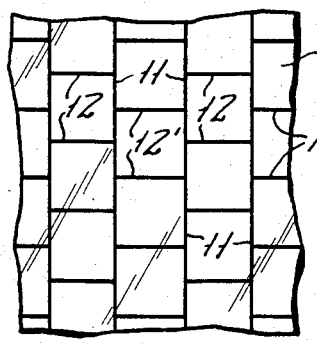
Figure 3:
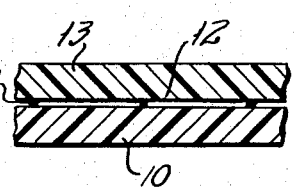
FIG. 3 is an enlarged sectional view through either of the embodiments of FIGS. 1 and 2, the section being illustratively indicated at 3—3 in FIG. 1.

In FIGS. 1 to 3, the invention is shown in application to a sheet 10 of flexible material of relatively high surface resistance, which may be a printgrade paper or plastic, even though shown sectioned for plastic. For example, the plastic may be polyethylene, nylon, mylar, polypropylene, or polyvinyl chloride, having at least one printable side; in the case of all of these plastics except polyvinyl chloride, corona-treatment is recommended for printability. In the case of print-grade paper, so-called kraft paper is suitable, alone or as an outer ply, as in the case of corrugated cardboard. Illustratively, surface resistance of the printable side of commercial transparent vinyl sheet, 2-mils thick, is in the order of $10^{10}$ ohms per square; such a product is available from Ross & Roberts, of Stratford, Conn., and is known as an "antistatic film".

In accordance with the invention, such relatively high surface resistance is reduced to a desirable static-dissipative level, in the order of $10^6$ to $10^9$ ohms per square (depending on application)*, by imprinting with an electrically conductive ink in an open-mesh matrix pattern, involving at least two intersecting sets of lines, defining plural conductive paths in each of two dimensional senses of the printed surface. In FIG. 1, the spaced lines 11 of one set are orthogonal to the spaced lines 12 of the other set; in FIG. 2, the same orthogonal relation applies, but the connections 12 between spaced successive pairs of lines 11 are in staggered interlace with the connections 12' between adjacent lines 11 of adjacent pairs. The electrical result is essentially the same, and the print-pattern configurations of both FIGS. 1 and 2 will each be understood as providing plural spaced conductive and intersecting sets of paths, orthogonally related to each other; it will also be understood that a thus-printed rendition of a chicken-wire or other mesh-like silhouette would meet the same electrical description.

* Strictly speaking, surface resistance of $10^5$ ohms per square or less is defined as "conductive"; surface resistance of $10^6$ to $10^9$ is defined as "static dissipative"; and surface resistance of $10^{10}$ to $10^{14}$ ohms per square is defined as "antistatic".

Also in accordance with the invention, the static-dissipative property noted with respect to sheet 10 (when conductively printed) is provided on the printed side by laminating, coating or otherwise covering the printed surface with a layer 13 of material of relatively high surface resistance. Such a material may be an unprinted sheet 13 similar to sheet 10; or if an elongate web of material 10 is conductively imprinted with spaced parallel lines at an acute angle to the longitudinal direction of the web, and if one length of such printed web is doubled back on itself and laminated with print side to print side, then the parallel lines of the respective laminated layers will contact at their multiple intersections, to complete the electrical integrity of the resulting conductive mesh between outer layers 10–13.

EXAMPLE I

A conductive-ink pattern was applied to the smooth surface of an embossed calendered film 10 of polyvinyl chloride, 2-mils thick, being a commercially available Ross & Roberts product. The pattern was an open-mesh matrix or grid, in the nature of that shown in FIG. 1. The intersecting lines 11–12 were 1/16-inch wide, and the enclosed open spaces were ¼-inch squares.

The ink used to define lines 11–12 comprised a mix of elastomeric and polymeric ingredients, with conductive carbon black, in a suitable solvent. More specifically, the mix comprised:

30 percent conductive carbon black (Cabot, "Vulcan XC-72")
40 percent polyvinyl chloride
30 percent elastomeric rubber These mix percentages are by weight, and the total mix was dissolved as a 20 percent dilute solution, using dimethylforamide (DMF) as the solvent. Subsequent exposure to curing temperature in a fusing oven evaporated the solvent, leaving a securely bonded residue of conductive mesh design. The bonding is flexible, and the thus-treated side of the sheet 10 exhibits a surface resistance of $2.7 \times 10^5$ ohms per square, as compared with a surface resistance of $1.4 \times 10^{10}$ ohms per square prior to printing. At the unprinted (embossed) side, the surface resistance measures at $1.2 \times 10^9$ ohms per square, as compared with $4 \times 10^{10}$ ohms per square prior to printing.

EXAMPLE II

One surface of a print-grade paper, illustratively kraft paper, or a kraft-paper outer ply of corrugated cardboard, is imprinted with a water-based conductive ink in accordance with a mesh pattern as in Example I. The ink comprises a mix consisting of:

30 percent conductive carbon black, as in Example I.
40 percent BL-100, being a water-based butyl-latex product of Burke-Palmason, Pompano Beach, Fla.
30 percent I-94, being a water-based print-ink vehicle base, product of Rohm & Haas, Philadelphia, Pa.

The mix is again diluted, but in water, to the extent that the dry components of the mix constitute 20 percent by weight of the ink solution. After printing, the water is evaporated and the ink is cured in a fusing oven. Surface resistance is in the $10^5$ ohms per square magnitude reported for Example I.

EXAMPLE III

The printed matrix of Examples I and II is applied by conventional gravure-printing techniques using a gravure cylinder and a continuous web of flexible sheet material, the application being continuous, in the course of continuous movement of the web through the gravure-printing zone. The matrix design, as in FIGS. 1 or 2 or the electrical equivalent, is imparted to the cylinder by known photo-etch techniques, to a line-width dimension of substantially 15 mils, leaving open areas of substantially one-half square inch bounded by intersecting sets of lines. Curing of the thus-printed web is a part of the same in-line continuous process as the printing. The product is measured, in the case of vinyl sheet, 20-mils thick, to be $2 \times 10^5$ ohms per square on the printed surface.

EXAMPLE IV

Based on a matrix design which was a photographic rendition of the silhouette of an open-weave fabric, said design being the engraved surface characterization of a gravure cylinder, and using conductive ink, a 3-mil polypropylene sheet of surface resistance of at least $10^{10}$ ohms per square was gravure-printed with the design. The ink was as described for Example I, except that "Ketchen EC", a more conductive carbon black, was used in place of the "Vulcan XC-72". After drying and curing, the resulting conductive-sheet product was measured for surface resistance on the printed surface, at $10^5$ ohms per square.

FIGS. 4 to 7 illustrate various applications of conductively printed flexible sheet materials, as described above, and rendered composite with a film 13 of imprinted material laminated to the printed side of film 10. Film 13 is suitably an embossed film of polyvinyl chloride, 2-mils thick, as illustratively stated for film 10.

Figure 4:
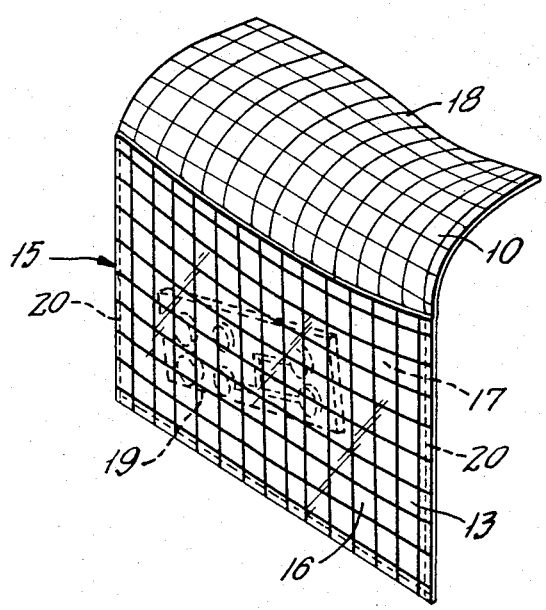
FIGS. 4, 5, 6 and 7 are perspective views to illustrate different container applications of the sheet materials of FIGS. 1 to 3.

In FIG. 4, a single thin transparent composite printed sheet, i.e., a composite of conductive printing between outer laminations of plastic sheet material, is cut and fabricated into a flexible bag 15, having front and back panels 16–17 wherein the free end 18 of the back panel is a flap by which access to delicate contents 19 is selectively closed; side edges are bonded, as by heat or ultrasonic seaming, on alignments 20. The sheet material of the outer laminations 10–13 may be polyethylene, nylon, mylar, polypropylene, polyvinyl chloride or the like. The printed conductive mesh is suitably selected for printed-surface resistance in the order of $10^5$ ohms per square and, after coating as described at 13, the material provides true non-sparking "Faraday-cage" protection of contents 19, which may be a micro-electronic circuit component or an integrated-circuit structure. The bag 15 thus shields against damaging reaction to an externally existent electrostatic field, as when a person having an electrostatic charge condition initially grasps the bag. Additionally, when the bag material is transparent or translucent, there is plenty of visibility of contents 19, to obviate unnecessary access to the contents 19.

Figure 5:
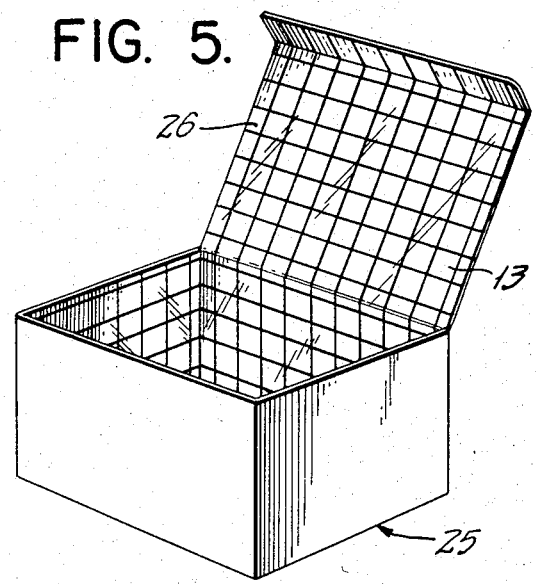

In FIG. 5, a conductively printed cardboard sheet has been cut and formed into a box 25 wherein the conductive mesh is on all the inner surfaces; the imprinted static-dissipative lamination 13 being applied to cover the conductive mesh on the inner surface. Closure of the lid 26 thus completes the electrostaticshield enclosure of any contents of the box. A body of suitable conductive foam (not shown) may substantially fill or line the box 25, to provide not only charge-dissipative protection but also mechanical-shock protection for a delicate, charge-sensitive electronic component.

Figure 6:
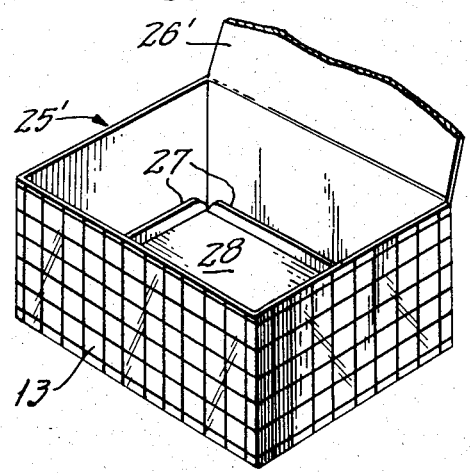

In FIG. 6, construction of a box 25' may be as described for FIG. 5 except that the conductively printed side of the sheet material for the box is assembled to define the outer surface of the box, the static-dissipative lamination 13 being applied to cover the conductive mesh on the outer surface.

Figure 7:
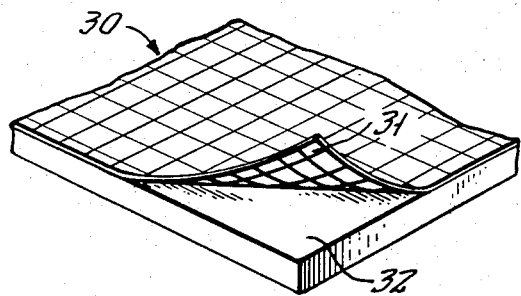

In the arrangement of FIG. 7, a static-dissipative mat 30, such as a floor mat beneath a desk chair, comprises a thin conductively printed flexible upper layer 31, adhered (with its printed side down) to a substantially thicker base or substrate layer 32; in the drawing, an unadhered corner of the upper layer is shown upwardly curled, to show that the printed underside thereof is applied in face-to-face adjacency to the base 32. Both layers 31–32 may be of vinyl, and the bottom layer is preferably of "rigid" vinyl. Illustratively, the upper layer 31 may be 20-mils thick, with an embossed upper surface to reduce reflection, and the lower layer 32 may be 3/16-inch thick. Bonding of layers 31–32 may be by suitable adhesive, or by heat and pressure, after curing the conductively inked impression.

In the event that the mat of FIG. 7 is to be used for electrostatic discharge of standing persons, it will be understood that the bottom layer 32 may be foamed, e.g., expanded vinyl, for greater foot comfort.

Figure 8:
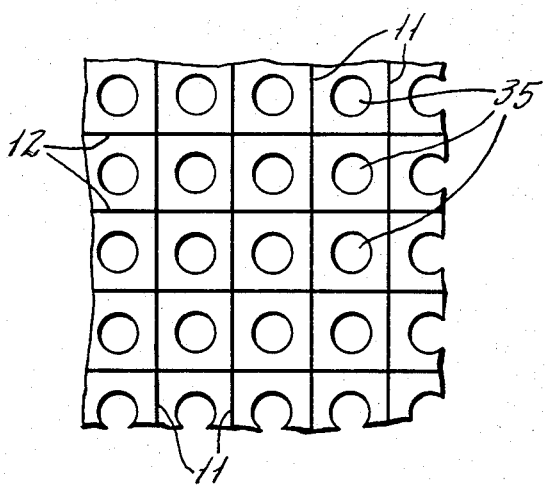
FIGS. 8 and 8A are views similar to FIGS. 1 and 3, respectively, to illustrate a modification.
Figure 8A:
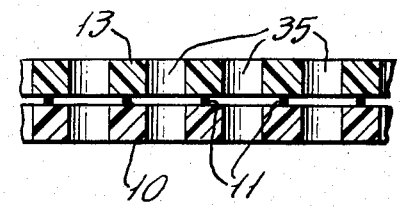

In the modification of FIGS. 8 and 8A, the base layer 10 may or may not be transparent, in that adequate see-through availability is obtained via a matrix of perforations 35, so registered with respect to the conductively printed matrix lines 11–12 as in no way to interfere with conductivity or integrity of the printed matrix. The material of FIGS. 8 and 8A may therefore be opaque, as in the case of kraft paper, and the perforations 35 may provide viewability sufficient to ascertain all that is needed, for example, whether a container made from material of FIGS. 8 and 8A does or does not contain anything. In spite of openings 35, static-dissipative "Faraday-cage" protection is just as well provided by a container made from FIG. 8/8A material as in the case for a container made from FIG. 1/3 or FIG. 2/3 material.

Figure 9:
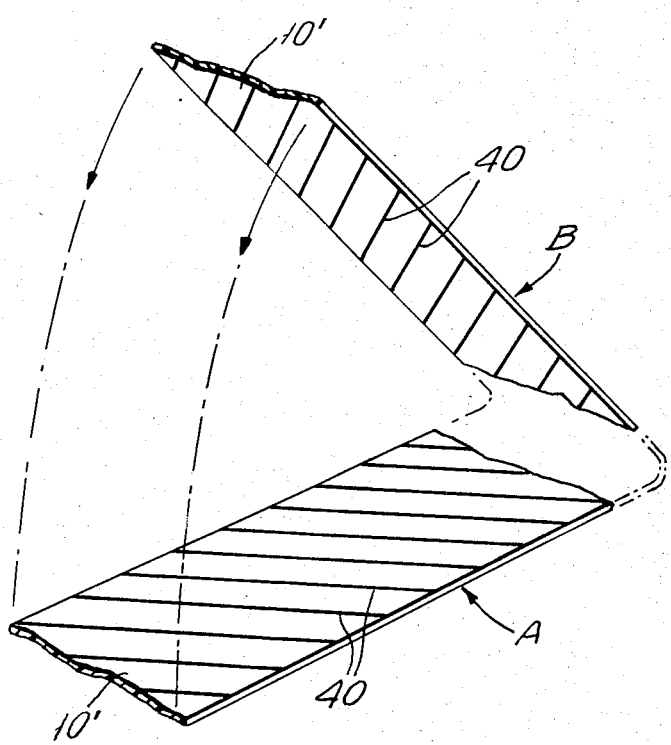
FIG. 9 is a fragmentary perspective diagram to illustrate a further modification.

In the modification of FIG. 9, a single web 10' of anti-static material, such as vinyl sheet 10 in FIG. 1, is conductively printed on one side, with parallel-line alignments 40 which are bias-sloped, as at 45°, with respect to the elongation of the web. Upon severance of the web into two parts A and B, and upon laminating both parts A and B to each other with their printed faces in contacting adjacency, as suggested by folding and directional arrows in FIG. 9, the completed product exhibits the characteristics given for other examples; namely, a conductive grid is established via the multiple intersections of the printed lines, and a static-dissipative condition exists between the conductive grid and both sides of the laminated product.

The described conductively printed flexible sheet materials will be seen to meet all stated objects and to be readily adaptable to continuous low-cost mass-production, using commercially available materials and ingredients. Furthermore, the illustratively described packaging and other applications are also inherently adapted to low-cost manufacture.

Not only does an enclosure made from presently described composite material provide electrostatic-field protection, without sparking via either surface (in the presence of normal static-charge accumulations), but the lamination over the printed surface provides assurance against wear or flaking of the printed mesh.

Economy of ink material and increased see-through visibility are both served by thin-line application of the printed matrix, line width ranging from 5 to 50 or more mils, but being preferably and suitably about 15 mils. These purposes are also served by designing the matrix for a preponderance of open area, wherein the proportion of conductively printed area to total area ranges between 0.1 to 50 percent, being preferably and suitably in the range of 1 to 5 percent.

While the invention has been described in detail for preferred embodiments, it will be understood that modifications may be made within the scope of the invention.

What is claimed is:

1. A static-dissipative electrostatically shielding container comprising an enclosure of size to fully contain an electronic circuit component or the like, said enclosure being fabricated from composite flexible sheet material, wherein the sheet material comprises inner and outer layers of transparent material characterized by relatively high resistivity, with an interposed printed open matrix of electrically conductive ink on at least one of the two confronting adjacent surfaces of said inner and outer layers, said matrix providing first and second intersecting sets of spaced plural conductive paths, whereby the inner layer provides anti-spark protection as between the conductive matrix and an enclosed circuit component, and the outer layer provides anti-spark protection as between the conductive matrix and a conductive source of voltage external to the container.

2. The container of claim 1, wherein said enclosure is selectively openable and closable, as for component removal and container reuse with a different circuit component.

3. A static-dissipative electrostatically shielding container comprising an enclosure fabricated from composite flexible sheet material, wherein the sheet material comprises first and second layers of transparent material characterized by relatively high resistivity, an interposed printed open matrix of electrically conductive ink between said layers, at least some of the printing being in the form of spaced continuous lines printed on one of said first and second layers, and some of the remaining printing being in the form of spaced continuous lines printed on the other of said layers, the lines of said printings being in mutually intersecting alignments and in electrical contact at such intersections.

4. A static-dissipative electrostatically shielding container comprising an enclosure fabricated from composite flexible sheet material, wherein the sheet material comprises first and second layers characterized by relatively high resisitivity, with an interposed printed open matrix of electrically conductive ink on at least one of the two confronting adjacent surfaces of said first and second layers, said matrix providing first and second intersecting sets of spaced plural conductive paths, and said sheet material being characterized by at least one perforation within each of a plurality of unprinted areas bounded by lines of said matrix.

5. A static-dissipative electrostatically shielding material comprising first and second layers of transparent material characterized by relatively high resistivity, an interposed printed open matrix of electrically conductive ink between said first and second layers, at least some of the printing being in the form of spaced lines printed on one of said first and second layers, and some of the remaining printing being in the form of spaced lines printed on the other of said first and second layers, the lines of said printings being in mutually intersecting alignments and in electrical contact at such intersections.

6. The shielding material of claim 5, in which the layer material is elongated web of sheet material, wherein the printing is on a bias orientation with respect to the longitudinal dimension of the web, whereby the mutually intersecting and electrically contacting relation may be achieved upon laminating two discrete lengths of such printed web in longitudinal register and with printed sides in face-to-face contact.

7. A static-dissipative electrostatically shielding material comprising first and second layers characterized by relatively high resistivity, with an interposed printed open matrix of electrically conductive ink on at least one of the two confronting adjacent surfaces of said first and second layers, said matrix providing first and second intersecting sets of spaced plural conductive paths, and said sheet material being characterized by at least one perforation within each of a plurality of unprinted areas bounded by lines of said matrix.

* * * * *